US006425103B1

(12) United States Patent
Phan

(10) Patent No.: US 6,425,103 B1
(45) Date of Patent: Jul. 23, 2002

(54) PROGRAMMABLE MOVING INVERSION SEQUENCER FOR MEMORY BIST ADDRESS GENERATION

(75) Inventor: Tuan Phan, Santa Clara, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/407,412

(22) Filed: Sep. 29, 1999

(51) Int. Cl.[7] .......................... G01R 31/28; G11C 8/00
(52) U.S. Cl. ...................... 714/733; 714/738; 365/221; 365/230.06; 365/230.08; 365/236; 365/239
(58) Field of Search .................................. 714/733, 738, 714/726; 365/221, 233, 230.06, 230.08, 236, 239, 240, 230.09, 230.01

(56) References Cited

U.S. PATENT DOCUMENTS

| 5,452,261 A | * | 9/1995 | Chung et al. ................. 365/233 |
| 5,822,228 A | | 10/1998 | Irrinki et al. ................. 714/718 |
| 5,883,905 A | * | 3/1999 | Eastburn ...................... 714/738 |
| 5,909,404 A | | 6/1999 | Schwarz ....................... 365/201 |
| 5,978,944 A | * | 11/1999 | Parvathala et al. .......... 714/726 |

OTHER PUBLICATIONS

4–Kilobit Memories Present a Challenge to Testing, Eugene R. Hnatek, DCA Reliability Laboratory, Mountain View, California, pp. 117–125.

Moving Inversions Test Pattern Is Thorough, Yet Speedy, J. Henk de Jonge and Andre J. Smulders, Philips Data Systems, Apeldorn, The Netherlands (5 pages).

* cited by examiner

Primary Examiner—Emmanuel L. Moise
(74) Attorney, Agent, or Firm—Conley, Rose & Tayon

(57) ABSTRACT

A low-complexity method and apparatus for generating address sequences for the moving inversion test method. In one embodiment, the address sequence generator includes a ring of counter cells in which each cell is configured to provide a toggle signal to a subsequent cell. Each cell receives a distinct least significant bit selector signal which, when asserted, designates the subsequent cell as the least significant bit. When the least significant selector signal is asserted, the cell continuously asserts the toggle signal to the subsequent cell. When the selector signal is de-asserted, the cell asserts the toggle signal to the subsequent cell half as often as the toggle signal from the preceding cell. Each cell provides an output address bit which is toggled whenever the toggle signal from the preceding bit is asserted across a transition in a clock signal. This configuration causes the ring of cells to implement a counter with a selectable least significant bit. As discussed herein, each cell may be implemented using only a toggle flip-flop and two logic gates. The addition of a direction signal and a third logic gate per cell makes the address sequencer bi-directional.

15 Claims, 7 Drawing Sheets

PROGRAMMABLE MOVING INVERSION SEQUENCER FOR MEMORY BIST ADDRESS GENERATION

BACKGROUND OF THE INVENTION

1. Field of the Invention

This invention relates to the field of digital electronic memory devices, and in particular to a built-in self test module for testing these devices in the field. More particularly, the invention relates to a programmable address generator suitable for implementing moving inversion algorithms.

2. Description of the Related Art

It is common practice for the manufacturers of memory chips to test the functionality of the memories at the manufacturing site. After the chips have been tested and certified for shipment, upon sale to the users, the users generally depend upon the reliability of the chips for their own systems to function properly. As the line width of memory cells within a memory array circuit chip continue to shrink (now at less than half a micron), this reliability becomes more difficult to achieve. One of the challenges for the manufacturers of memory devices, is to increase memory capacity without decreasing chip yields due to malfunctioning parts.

Before the memory chips are released for shipment, they typically undergo testing to verify that each of the memory cells within the memory array is functioning properly. This testing method is routinely done because it is not uncommon for a significant percentage of the memory cells within the chip to fail, either because of manufacturing defects or degradation faults.

In the past, chip memories have been tested using an external memory tester or Automatic Test Equipment (ATE) at the manufacturing site. This testing technique is not available to users once the chips have been shipped, making it difficult to detect faulty memory cells at the user site. Even if test equipment is available to users, field repairs are expensive, time-consuming, and impractical.

In conjunction with testing at the manufacturing site, some repairs of memories have also been performed at the manufacturing site. Conventional repairing techniques bypass the defective cells using fuseable links that cause address redirection. However, these techniques require significant capital investment for implementing the technical complexity of the repairing process, and moreover, fail to address the possibility of failure after shipment from the manufacturing facility.

Because of the difficulty of field repairs, some memory chips have been equipped with built-in self test (BIST) and built-in self repair (BISR) circuitry. As used herein, the term "BIST" refers to the actual test, while "BIST module" and "BIST circuitry" refer to the circuitry that performs BIST. Similarly, "BISR" refers to the process of built-in self repair, while "BISR module" and "BISR circuitry" refer to the circuitry that performs BISR. BIST operates by writing and reading various patterns to/from the memory to determine various kinds of memory faults. In general, a BIST module writes a data value to a memory cell and subsequently reads the memory cell. By comparing the data written and the data subsequently returned from the memory cell, the BIST module is able to determine whether the memory cell is faulty. If failing cells are present, the BISR circuitry reassigns the row or column containing the failing cell to a spare row or column in the memory array. Generally, BIST and BISR are performed each time power is applied to the system, and thus, latent failures that occur between subsequent system power-ups may be detected in the field.

Several classes of fault detection methods are well known, as illustrated by E. R. Hnatek in "4-Kilobit Memories Present a Challenge to Testing", *Computer Design*, May 1975, pp. 117–125, which is hereby incorporated herein by reference. As Hnatek discusses, there are several considerations that should be taken into account when selecting a fault detection method, including fault coverage and length of the test procedure. Also, since no practical method provides complete coverage, the suitability of the various methods for detecting particular types of faults should be considered.

One class of methods which may provide significantly better coverage with only a small increase in the number of steps over the popular Marching 0's and 1's class is the Moving Inversions class. As described in J. H. de Jonge and A. J. Smulders in "Moving Inversions Test Pattern Is Thorough, Yet Speedy", which is hereby incorporated herein by reference, the Moving Inversions method is as follows. The memory has $2^n$ words (n is the number of address bits) that are initially loaded with 0's. The address is sequenced through all the addresses, and at each address, the memory word is first read to verify the presence of all zeros, then written with all ones, and then read to verify the presence of all ones. After the memory is filled with ones, this process is then repeated with ones and zeros exchanged. These two processes are repeated or a total of 2n different addressing sequences. The 2n sequences are generated by changing he address increment (n increments) and direction (2 directions), so that the increments for the sequences are $+2^i$, $0<i<n$. Every overflow generates an end-around carry, so that all addresses are tested once in each sequence. This results in $12 \cdot B \cdot n \cdot 2^n$ tests, where B is the number of bits in each word. Some variations of this method include using different data patterns (e.g. checkerboard, alternating columns, alternating rows) and adding checks and rewrites of previous and/or subsequent addresses. Other variations may include using only a selected few of the address sequences. Generally, the class of Moving Inversion methods may be characterized by the use of two or more address sequences with increments of the form $\pm 2^i$, $0<i<n$, and end-around carry.

A potential problem with using a Moving Inversion method for BIST lies in the hardware requirements for generating the address sequences. The popularity of the Marching 0's/1's is at least in part due to the simplicity of the addressing sequence which can be generated with a counter. The Moving Inversion method apparently requires an n-bit adder to add a selectable increment to each address. This is undesirable, as it is necessary to maximize the BIST speed, and fast adders require an excessive increase in hardware complexity. Unless a better solution can be found, the advantages of the Moving Inversion methods will be foregone in favor of the faster, but less effective, Marching 0's/1's methods. End users will be forced to expend more money and effort to eliminate unreliable components.

SUMMARY OF THE INVENTION

Accordingly, there is disclosed herein a low-complexity method and apparatus for generating address sequences for the moving inversion test method. In one embodiment, the address sequence generator includes a ring of counter cells in which each cell is configured to provide a toggle signal to a subsequent cell. Each cell receives a distinct least significant bit selector signal which, when asserted, designates the subsequent cell as the least significant bit. When the least significant selector signal is asserted, the cell continuously asserts the toggle signal to the subsequent cell. When the selector signal is de-asserted, the cell asserts the toggle signal to the subsequent cell half as often as the toggle signal from the preceding cell. Each cell provides an output address bit which is toggled whenever the toggle signal from the preceding bit is asserted across a transition in a clock signal. This configuration causes the ring of cells to implement a counter with a selectable least significant bit. As discussed herein, each cell may be implemented using only a toggle flip-flop and two logic gates. The addition of a direction signal and a third logic gate per cell makes the address sequencer bi-directional.

BRIEF DESCRIPTION OF THE DRAWINGS

Other objects and advantages of the invention will become apparent upon reading the following detailed description and upon reference to the accompanying drawings in which.

Figure 1:
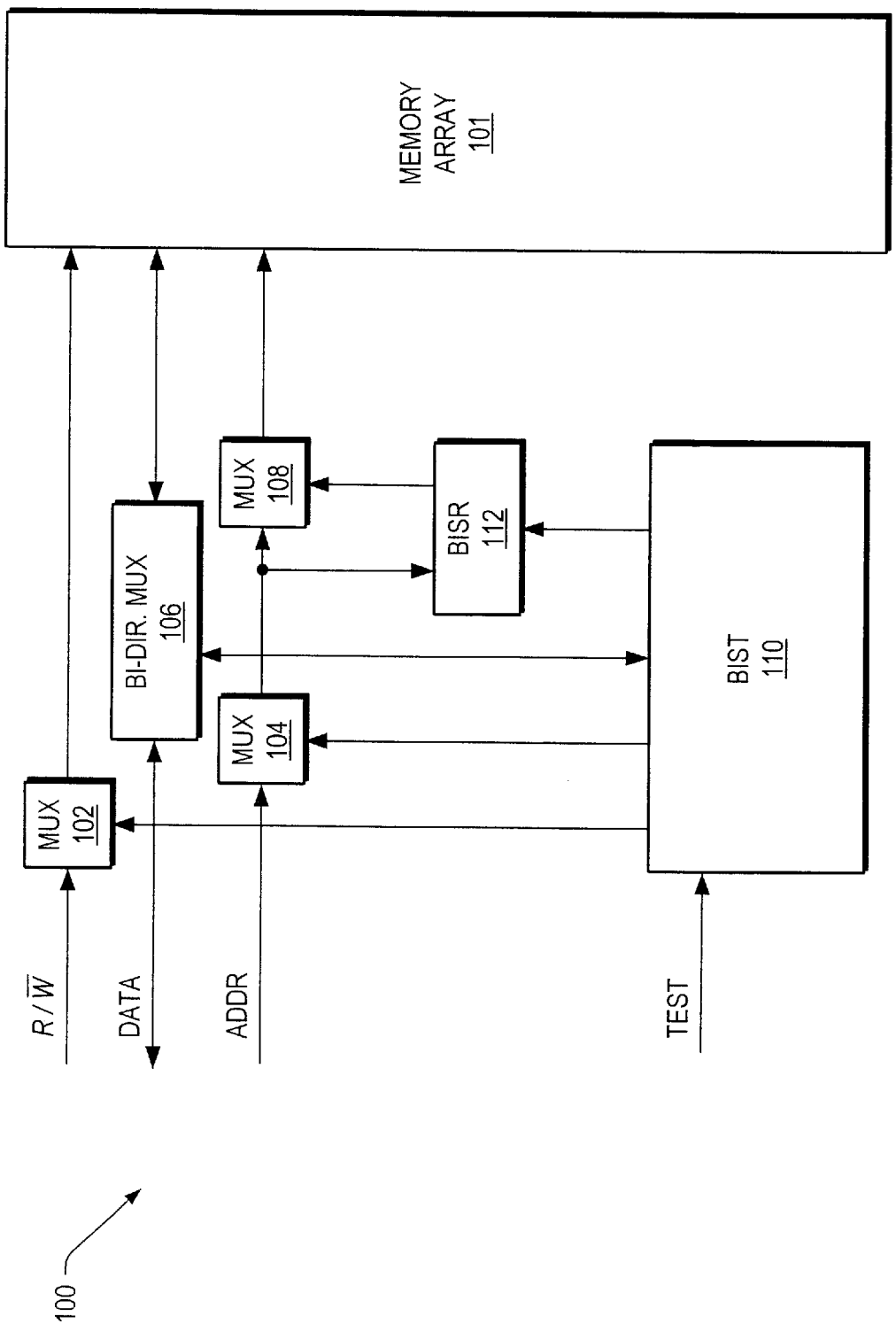
FIG. 1 depicts a block diagram of one embodiment of a memory storage device 100 capable of built-in self test and repair.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

In the following description, the terms "assert" and "de-assert" are used when discussing logic signals. When a logic signal is said to be asserted, this indicates that an active-high signal is driven high, whereas an active-low signal is driven low. Conversely, de-assertion indicates that an active-high signal is driven low, and that an active-low signal is driven high.

DETAILED DESCRIPTION OF THE INVENTION

Turning now to FIG. 1, there is shown a block diagram of one embodiment of a memory storage device 100 capable of built-in self test and repair. The memory storage device 100 includes a memory array 101, multiplexers 102, 104, 106 and 108, a built-in self test (BIST) module 110, and a built-in self repair (BISR) module 112.

The memory array 101 receives an address signal (ADDR) and a read/write signal (R/W̄), and either receives or provides a data signal. If the read/write signal indicates a write operation, memory array 101 stores the data represented by the data signal in a memory location indicated by the address signal. If the read/write signal indicates a read operation, memory array 101 detects the data stored in the memory location indicated by the address signal and drives the data signal on the data lines. The multiplexers 102, 104, 106, and 108 provide for steering and re-direction of the address, data, and read/write signals.

Assertion of the test signal (TEST) enables the BIST module 110. The test signal may be asserted by an operating system or software application running on a CPU coupled to the memory device 100, or it may be asserted in response to an event such as power-on, reset, reaching a predetermined temperature, or expiry of a predetermined time delay.

BIST module 110 controls multiplexers 102, 104 and 106. When the BIST module 110 is enabled, multiplexers 102 and 104 forward the read/write and address signals, respectively, from the BIST module 110 to memory array 101. For test write operations, multiplexer 106 forwards test data from the BIST module 110 to memory array 101. For test read operations, multiplexer 106 directs data from memory array 101 to the BIST module 110. Multiplexer 108 is controlled by the BISR module 112. As explained further below, when the BISR module 112 detects an address to a faulty memory location, it maps the address to the address of a redundant memory location. The multiplexer 108 is then used to select the uncorrected address when no fault location is recognized by the BISR module 112, and to select the re-mapped address when the BISR module 112 detects an address to a faulty memory location.

Generally speaking, memory device 100 may provide improved BIST and BISR functionality by using a Moving Inversion fault detection method. In one embodiment, BIST module 110 employs a Moving Inversion method to determine the locations of faulty cells from the memory array 101. Since the Moving Inversion method exhibits improved fault coverage relative to currently used methods, the BIST module may advantageously detect faults that would ordinarily be missed.

In a preferred embodiment of memory device 100, memory array 101, BIST module 110, and BISR module 112, are integrated onto a common substrate, potentially along with other components. Thus, the time required to perform BIST and BISR may be advantageously decreased due to the higher clock rates and shorter data path lengths attainable within a common substrate.

BIST module 110 cycles memory array 101 through various Moving Inversion test patterns upon power-up. Every time a failing row or column is detected, this information is conveyed to BISR module 112, which attempts to reassign accesses to the failing location to a redundant row or column within the memory array 101. BISR module 112 monitors all incoming addresses to determine if any match one of the failing addresses detected by the BIST module 110. If a match is found, BISR module 112 provides a corrected address via multiplexer 108 so that the reassigned memory location is accessed instead of the location originally addressed.

Figure 2:
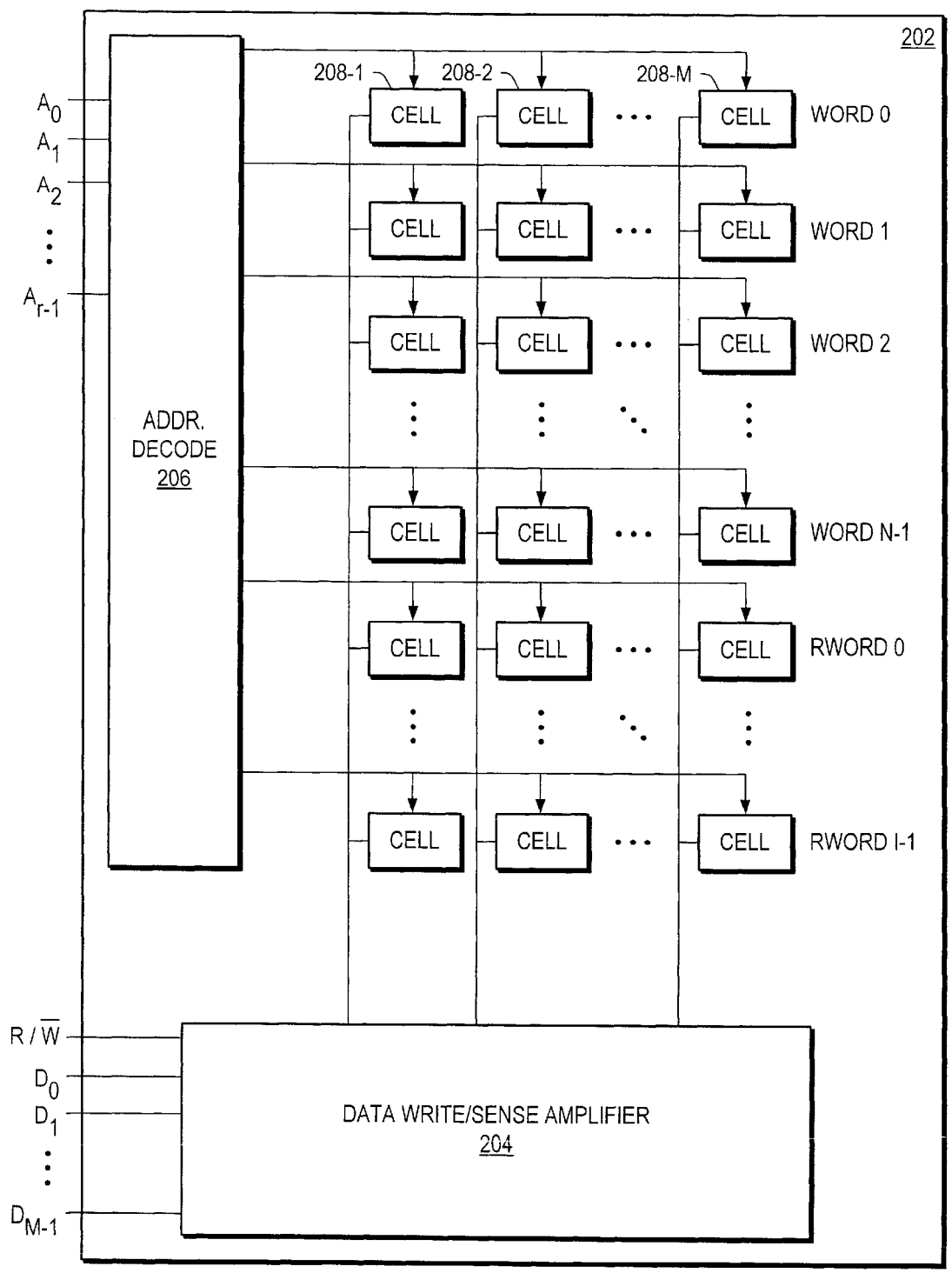
FIG. 2 depicts a block diagram of one embodiment of a memory array.

Referring now to FIG. 2, a block diagram of one embodiment of the memory array 101 is shown. The memory array 101 includes a ground plane 202, a data write/sense amplifier block 204, an address decoder 206, and a plurality of memory cells 208-1 through 208-M. The ground plane 202 is a conductive path held at a constant voltage to shield the signal lines within the memory array from electrical noise.

The data write/sense amplifier block 204 senses data stored in a row of memory cells during a read operation and drives the detected data on data lines $D_0$ through $D_{M-1}$. The data write/sense amplifier block 204 retrieves data from data lines $D_0$ through $D_{M-1}$ and stores the data in a row of memory cells during a write operation. The type of operation being performed by the data write/sense amplifier block is controlled by the read/write line.

Each row of memory cells is referred to as a word. The memory cells are organized into N rows (WORD 0 through WORD N-1) and I redundant rows (RWORD 0 through RWORD I-1). The row of memory cells being read from or written to is determined by the address decoder 206 which receives an address on lines $A_0$ through $A_{r-1}$ and responsively asserts a word line. The row of cells coupled to the asserted word line can then be accessed for read or write operations. The memory array 101 includes a set of redundant words which can be used in place of faulty words. When a faulty word is detected, subsequent accesses to the address of the faulty word can be redirected to one of the redundant words.

Figure 3:
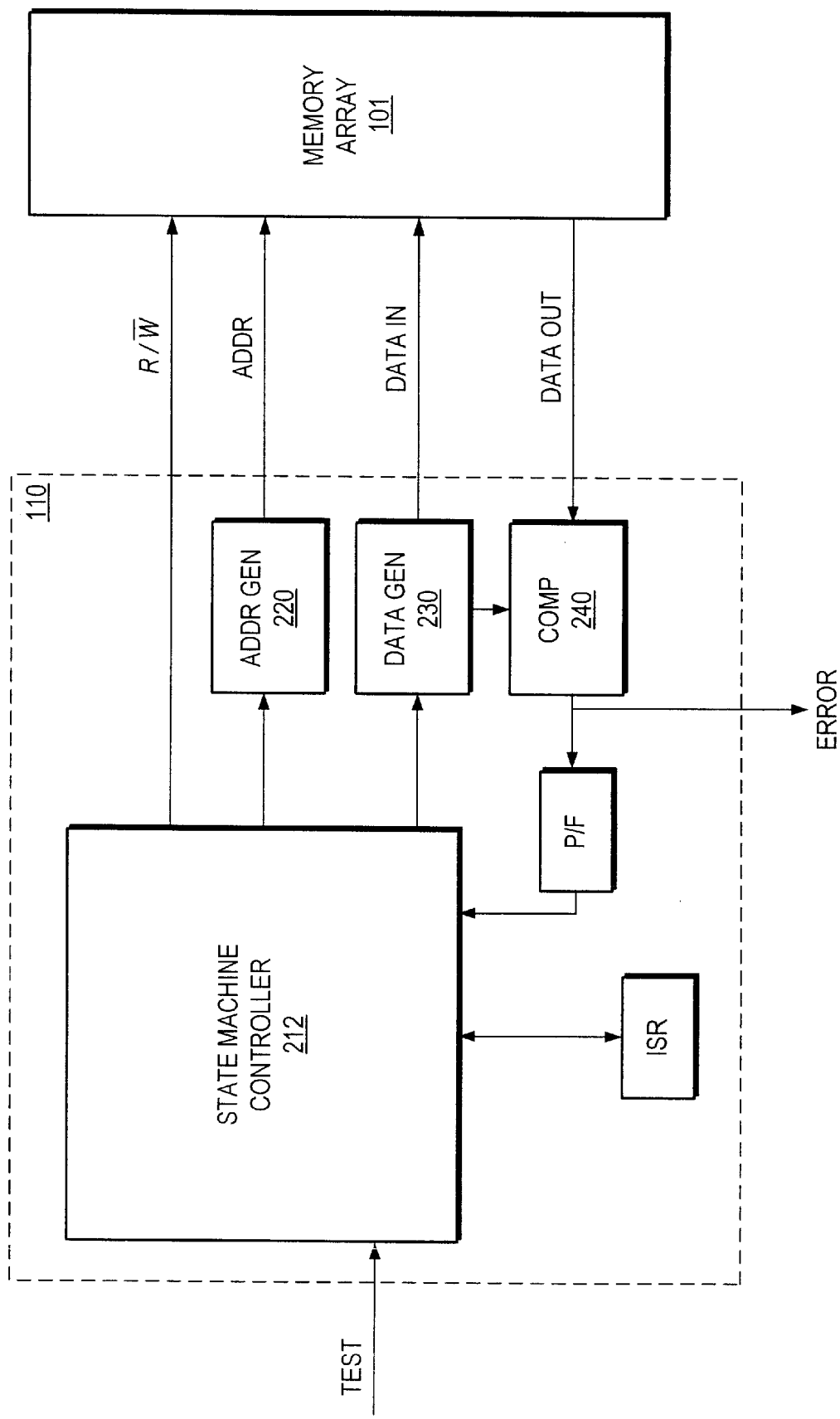
FIG. 3 depicts a block diagram of one embodiment of built-in self test circuitry within a memory storage device.

Referring now to FIG. 3, a functional block diagram of one embodiment of BIST module 110 is shown in greater detail. Circuit portions corresponding to those of FIG. 1 are numbered identically. Portions of BIST module 110 depicted in FIG. 3 include a state machine controller 212, a BIST address generator 220, a BIST data generator 230, a comparator 240, a pass/fail register (P/F), and an initial state register (ISR). State machine controller 212 drives a BIST read/write signal to memory array 101, as well as inputs to BIST address generator 220 and BIST data generator 230.

During a write access, BIST address generator 220 drives a BIST address to memory array 101, while BIST data generator 230 drives a BIST data in signal to memory array 101. During a read access, comparator 240 receives a data out signal from memory array 101 and an expected data signal from data generator 230. The BIST address signal and BIST read/write signals include control signals for operating multiplexers 102, 104, and 106 (FIG. 1). The output of comparator 240, an error signal, is conveyed to BISR module 112, where it is processed as described further below. The output of comparator 240 is also conveyed to pass/fail register (P/F). The output of the pass/fail register P/F is conveyed to the state machine controller 212. The initial state register ISR is coupled to the state machine controller 212.

State machine controller 212 is configured to direct the determination of column faults, row faults, bridging faults, "stuck-at" faults, and data retention faults in memory array 101. Column and row faults are caused by defective bit lines and defective word lines, respectively. A bridging fault indicates a cell is shorted to an adjoining cell, and stuck-at faults indicate a particular cell is "stuck" at a certain value. Data retention faults indicate the cell has failed to retain the data written to it. As discussed further below, BISR module 112 is connected to memory array 101 to repair faults detected by BIST module 110. The BIST module 110 transfers detected fault addresses to BISR module 112 to enable BISR module 112 to repair the faults.

State machine controller 212, address generator 220, and data generator 230 operate to generate patterns for detecting column faults, row faults, bridging faults, "stuck-at" faults, and data retention faults. These elements produce a data pattern that provides fault coverage for identifying the faulty memory cells.

In one embodiment, memory faults are detected by performing a Moving Inversion test variation. The variation preferably comprises a subset of the complete Moving Inversion test. It has been empirically observed that, depending on the device, certain addressing sequences in the Moving Inversion test are more successful at uncovering faults than others. It has been further observed that all of the faults which were detected could have been detected using only a subset of the addressing sequences. Thus, experience indicates that complete or near-complete coverage can be achieved using selected ones of the addressing sequences. It is expected that in the initial characterization of a device, the complete Moving Inversion method would be used. As statistics are compiled and confidence in the device is achieved, the test method would be modified to eliminate redundant addressing sequences. To make this modification easy, the state machine controller 212 is preferably programmable. This may be achieved by the use of configuration parameters in the initial state register (ISR). For example, the ISR may include bits indicating which addressing sequences to run.

For each selected addressing sequence in the Moving Inversion test, state machine controller 212 directs BIST address generator 220 to generate addresses for every location of memory array 101. In one embodiment, address generator 220 is a moving inversion sequence generator as described further below. Address generator 220 may be initialized to point to the first address in memory array 101, and may subsequently cycle through the addresses of all available locations in the memory array 101 in response to appropriate input signals from state machine controller 212. For each location of the memory array 101, state machine controller 212 preferably directs a Read DATA, Write $\overline{\text{DATA}}$, Read $\overline{\text{DATA}}$ on the addressed location (where DATA is the expected data pattern at the address location) and directs verification of the read information.

During the first read, data generator 230 provides the expected data value (DATA) to the comparator 240 in response to control signals from state machine controller 212. During the write, data generator 230 drives the data in signal with the complement ($\overline{\text{DATA}}$) of the original expected data value, and also provides the complement to comparator 240 during the second read. The contents of the addressed memory location are supplied to comparator 240 as the data out signal from the memory array 101.

Comparator 240 compares the data value from the data generator 230 to the data value returned from the addressed location to determine whether or not a fault is detectable at the addressed location. The output of comparator 240 is provided to BISR module 112 as an error signal to enable repair of detected faults. In particular, when comparator 240 detects a mismatch between the data values, the output of comparator 240 serves as an error signal which induces BISR module 112 to substitute the failing location address with the address of a redundant word of the memory array 101.

After BIST module 110 has completed testing of the memory array 101, state machine controller 212 becomes inactive, and the multiplexers 102, 104, and 106 are set to select the external read/write, address, and data signal lines. At this point, memory storage device 100 can now satisfy requests for memory array 101 from the external pins.

Figure 4:
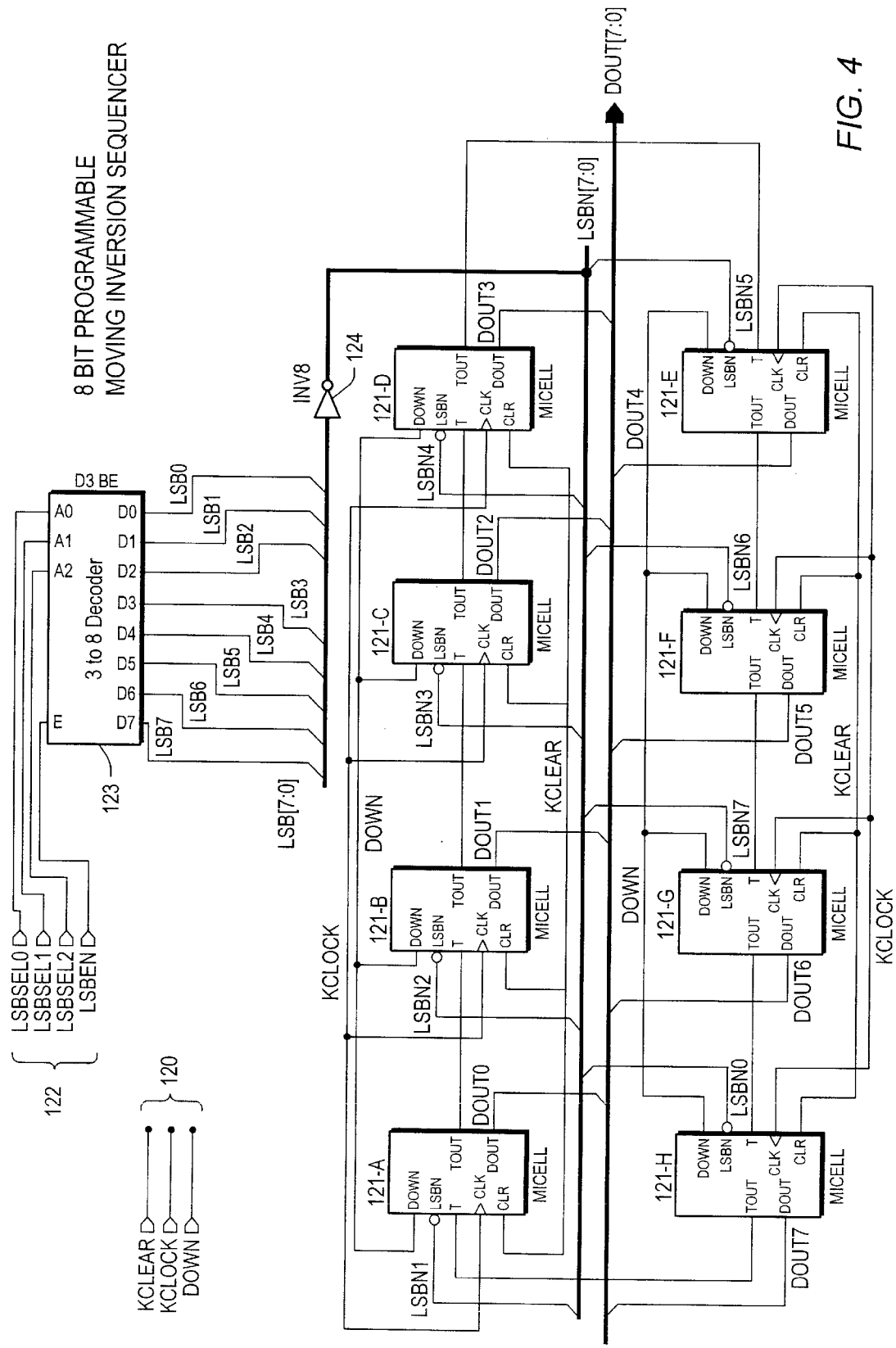
FIG. 4 depicts a block diagram of one embodiment of a moving inversion sequence generator.

Referring now to FIG. 4, a block diagram of one embodiment of address generator 220 is shown. Address generator 220 receives inputs 120 which include a clear signal KCLEAR, a clock signal KCLOCK, and a direction signal DOWN. Inputs 120 are coupled to each of eight Moving Inversion sequencer cells (MICELLS) 121-A through 121-

H. Address generator 220 also receives least significant bit (LSB) selector inputs 122 which include three bit lines (LSBSEL0, LSBSEL1, LSBSEL2) and an enable line (LSBEN). The LSB selector inputs 122 are coupled to a 3-to-8 decoder 123. Decoder 123 asserts the one LSB line (LSB0–LSB7) that corresponds to the binary number representation carried on LSB selector inputs 122. The signals on the LSB lines are inverted by inverters 124 to provide eight inverted LSB lines (LSBN0–LSBN7). Each of the LSBN lines is coupled to a corresponding MICELL 121. LSBN0 is coupled to MICELL 121-H, LSBN1 is coupled to MICELL 121-A, LSBN2 is coupled to MICELL 121-B, etc., so that when a MICELL is selected as a least significant bit, the preceding MICELL receives an asserted (active-low) LSBN signal.

The MICELLS 121 each receive a clear signal, a clock signal, a direction signal, a LSBN signal, and an input toggle signal (T), and the MICELLS 121 each provide an output toggle signal (TOUT) and a data output signal (DOUT0–DOUT7). The output toggle signal of each MICELL is coupled to the input toggle signal of the subsequent MICELL, so that the MICELLS form a ring. The data output signals are combined to form an eight bit address from the address generator 220.

In operation, one of the MICELLS is selected as the LSB. The ring of MICELLS acts as a counter. The counter is reset to zero (or all ones if the direction signal is asserted) by the clear signal, and then the clock signal starts incrementing the counter in the direction indicated by the direction signal. Each chosen LSB and direction combination corresponds to an address sequence of the Moving Inversion method.

Figure 5:
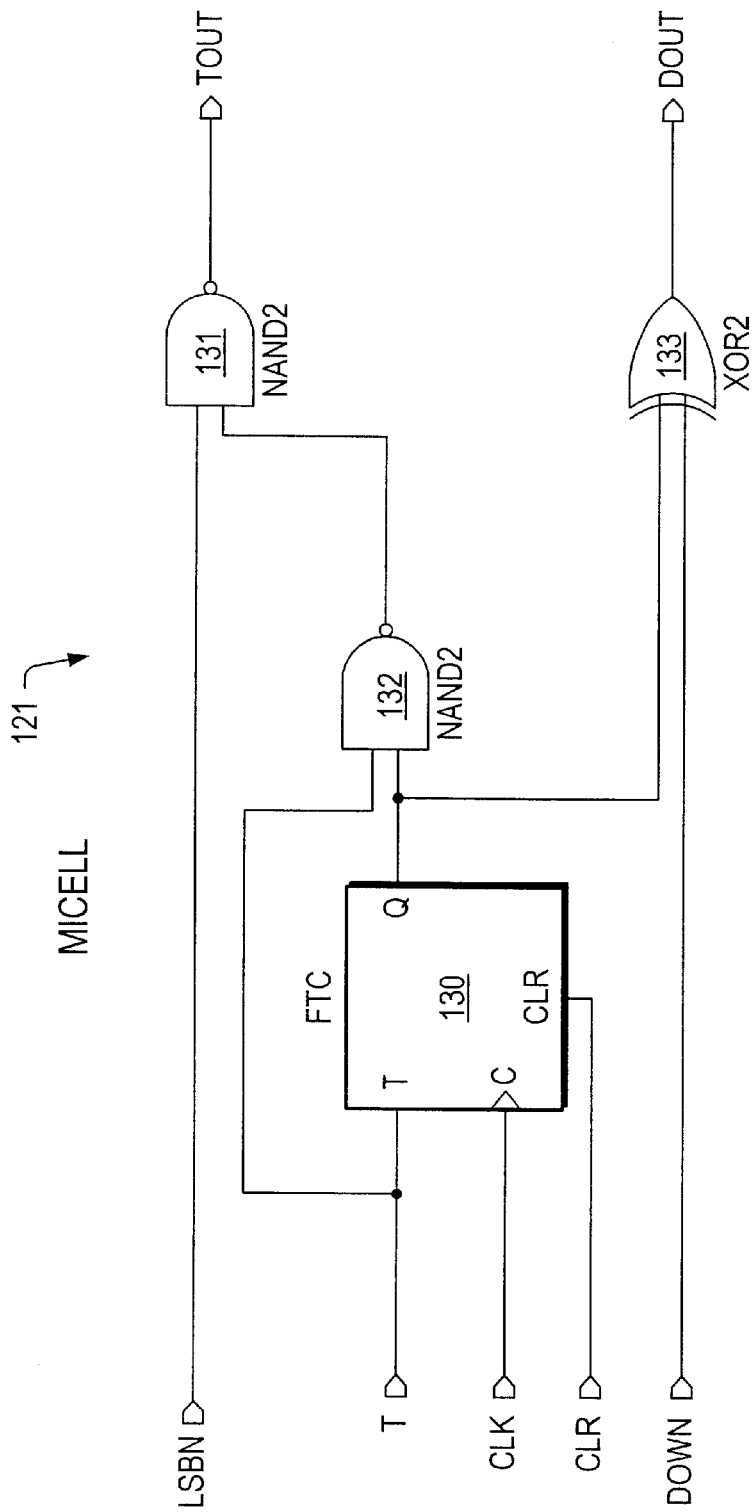
FIG. 5 depicts a block diagram of one embodiment of a moving inversion sequencer cell.

FIG. 5 shows one embodiment of an MICELL 121 which is based on a positive edge toggle flip-flop 130 with asynchronous clear. If the clear signal is not asserted, flip-flop 130 inverts its output Q whenever input T is asserted across a positive clock edge in the clock signal. MICELL 121 also includes two NAND gates 131, 132, and an XOR gate 133.

The output of NAND gate 132 goes low only when both state Q and input T are high. Since the state Q toggles for every assertion of input T, gate 132 provides an inverted half-frequency toggle signal. NAND gate 131 receives this inverted half-frequency toggle signal as one input and receives an LSBN signal as the other input. When the subsequent MICELL is not selected as a least significant bit, the LSBN signal is high, and gate 131 provides a non-inverted half-frequency toggle signal as output TOUT. When the subsequent MICELL is selected as a least significant bit, the LSBN signal is low, and gate 131 provides a continuously-high toggle signal as TOUT. Accordingly, the MICELL selected as a least significant bit will receive a continuously-high toggle signal, and each subsequent MICELL will receive a toggle that is asserted half as often as the preceding toggle signal.

XOR gate 133 receives the state Q signal and the input direction signal. When counting upward, the direction signal is low, and the Q signal is provided as output bit DOUT. When counting downward, the direction signal is high, and an inverted Q signal is provided as output bit DOUT.

Figure 6:
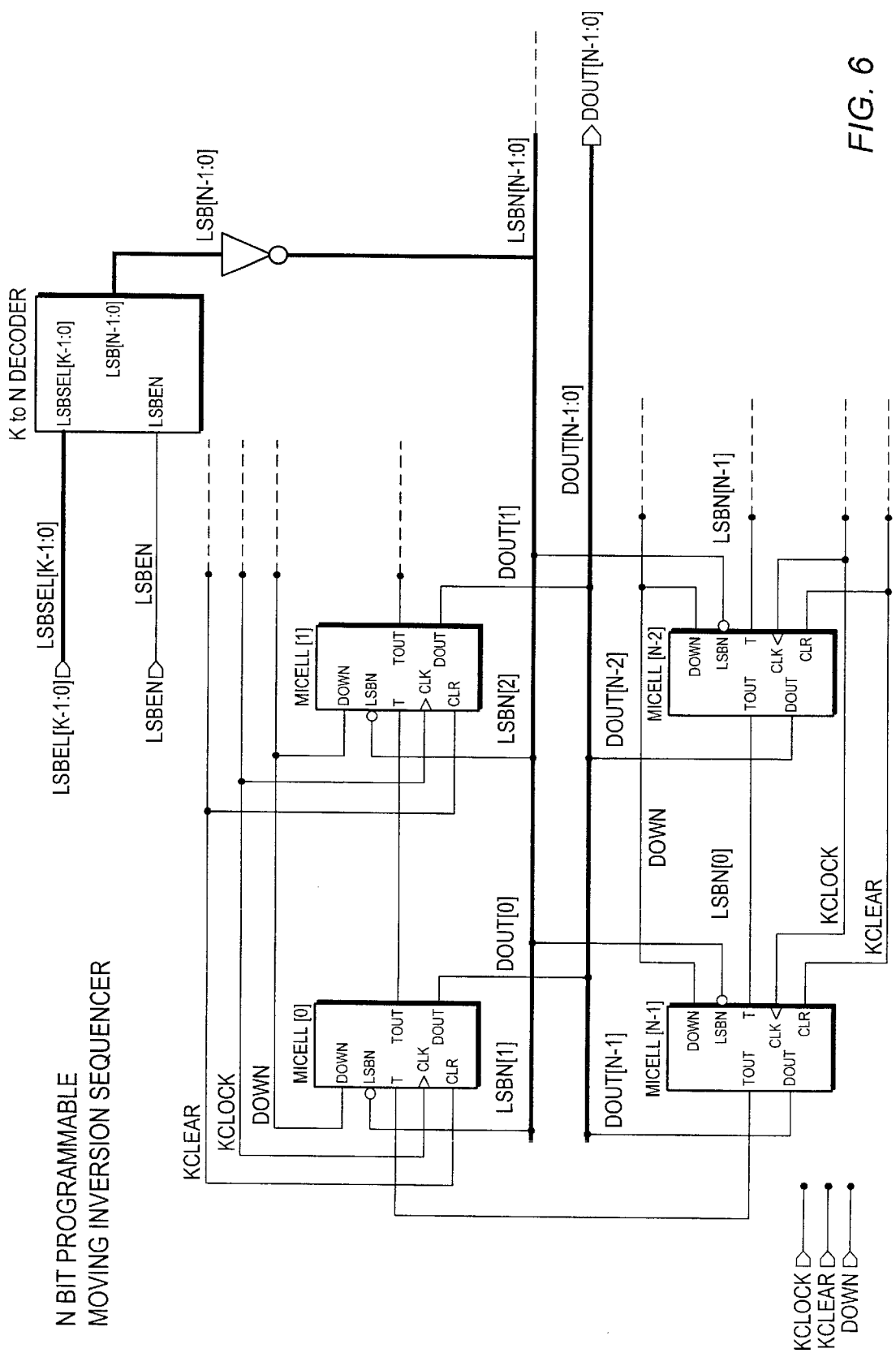
FIG. 6 depicts a block diagram of a generalized embodiment of the sequence generator of FIG. 4.

The moving inversion sequencer is scaleable as shown by the generalized sequencer in FIG. 6. The moving inversion sequencer is advantageously comparable in complexity to a simple binary counter, with the only significant increase in complexity being the inclusion of the decoder 123. Nonetheless, this small increase in complexity may be substantially less than that which would be incurred by the inclusion of a fast adder.

Figure 7:
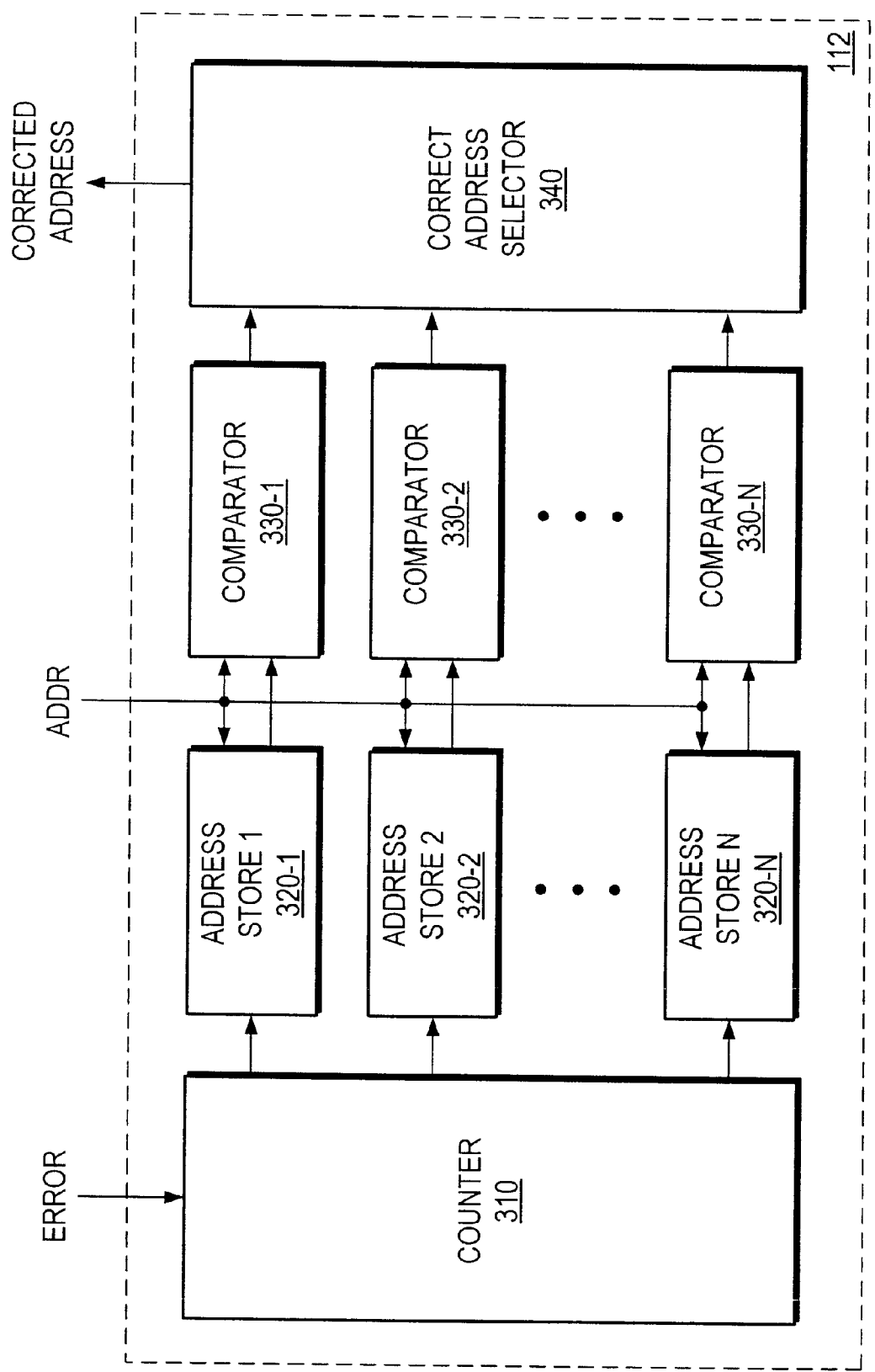
FIG. 7 depicts a block diagram of one embodiment of built-in self repair circuitry within a memory device.

Returning momentarily to FIG. 1, it is noted that there exists a variety of architectures and methods for performing BISR. For example, FIG. 7 shows a block diagram of one possible embodiment of BISR module 112. As illustrated, BISR module 112 comprises a counter 310, a plurality of address store units 320-1 through 320-N, a group of comparators 330-1 though 330-N, and an address selector 340. When an error is detected by the BIST module 110, counter 310 sends a latch signal to one of the address stores 320, then increments. The address stores 320 are coupled to receive the uncorrected address signal at the input of multiplexer 108, and to store the uncorrected address when a corresponding latch signal is asserted. In this manner, a plurality of faulty addresses can be stored by BISR module 112. After one or more addresses have been stored, subsequent uncorrected addresses are compared by the comparators 330 to the stored addresses. A match to one of the stored addresses causes the corresponding comparator to trigger the address selector 340 to drive a corrected address to multiplexer 108 along with a control signal which causes multiplexer 108 to replace the uncorrected address with the corrected address. In this way, accesses to faulty memory locations are shunted to redundant memory locations. If more than N faulty locations are detected, counter 310 saturates, and a fatal error is indicated. A fatal error signal informs the user that the chip is not repairable and should be replaced.

In another implementation, the addresses stored and corrected by the BISR module 112 are column and/or row addresses, and separate counter, store, comparator, and selector elements are used for the column and row portions of the addresses. This allows faulty memory location replacement to occur on a column and/or row basis.

After BIST has completed, memory storage device 100 will commence normal operation. Requests to memory array 101 will be made on external address, read/write, and data signals, instead of the corresponding BIST-generated signals. In this case, the external address signal will be selected by address multiplexer 104 and conveyed upon the uncorrected address line to the BISR module 112 and correction multiplexer 108. If a match is found by the comparators 320 in BISR module 112, the address selector 340 in BISR module 112 will drive a corrected address and a multiplexer control signal to correction multiplexer 108. If a match is not found by the comparators 320, the uncorrected address is allowed to propagate through the correction multiplexer 108.

Numerous variations and modifications will become apparent to those skilled in the art once the above disclosure is fully appreciated. It is intended that the following claims be interpreted to embrace all such variations and modifications.

What is claimed is:

1. A sequencer which comprises:

a ring of counter cells, wherein each cell is configured to receive: a clock signal and a respective least significant bit signal, wherein each cell is configured to provide: a toggle signal to a subsequent cell and a respective output bit signal, wherein each cell is configured to toggle the output bit signal when a toggle signal from a preceding cell is asserted across a transition in the clock signal, wherein each cell is configured to assert the toggle signal to the subsequent cell substantially half as often as the toggle signal from the preceding cell when the least significant bit signal is de-asserted, and wherein each cell is configured to assert the toggle signal to the subsequent cell when the least significant bit signal is asserted.

2. The sequencer of claim 1, wherein each cell is further configured to receive a direction signal and configured to invert the output bit signal when the direction signal is asserted.

3. The sequencer of claim 1, wherein each cell is further configured to receive a clear signal and configured to reset the output bit signal to a predetermined state when the reset signal is asserted.

4. The sequencer of claim 1, wherein each cell includes:
a flip-flop coupled to receive the clock signal and the toggle signal from the preceding cell, wherein the flip-flop is configured to toggle a state signal in response to assertion of the toggle signal during a clock transition.

5. The sequencer of claim 4, wherein each cell further includes:
a logic gate coupled to receive the toggle signal and the state signal, and configured to assert a gate output signal only if both the toggle signal and the state signal are concurrently asserted.

6. The sequencer of claim 5, wherein each cell further includes:
a second logic gate coupled to receive the least significant bit signal and the gate output signal, and coupled to provide the toggle signal to the subsequent cell, wherein the second logic gate is configured to assert the toggle signal to the subsequent cell if at least one of the least significant bit signal and the gate output signal is asserted.

7. The sequencer of claim 6, wherein each cell further includes:
a third logic gate coupled to receive the state signal and a direction signal, and coupled to provide the output bit signal, wherein the third logic gate is configured to invert the state signal when the direction signal is asserted.

8. The sequencer of claim 1, further comprising:
a decoder configured to receive a number signal, and configured to responsively assert a corresponding one of the least significant bit signals.

9. A moving inversion address sequencer which comprises:
a K to N decoder configured to receive a K-bit binary number and configured to assert a corresponding one of N least significant bit select signal lines; and
a plurality of N cells each coupled to the decoder to receive a respective one of the least significant bit select signals, wherein each of the cells is configured to receive a toggle signal from a previous cell and a clock signal, wherein each of the cells includes:
a flip-flop coupled to the previous cell to receive the toggle signal and configured to receive the clock signal, wherein the flip-flop is configured to toggle a state signal if the toggle signal is asserted when the clock signal is asserted;
a first logic gate coupled to the flip-flop to receive the state signal and the toggle signal, wherein the first logic gate is configured to assert a gated toggle signal when both the state signal and the toggle signal are asserted; and
a second logic gate coupled to the first logic gate to receive the gated toggle signal and configured to receive the least significant bit signal, wherein the second logic gate is configured to assert an output toggle signal when either of the least significant bit signal and the gated toggle signal are asserted.

10. The sequencer of claim 9, wherein each of the cells further includes:
a third logic gate coupled to receive the state signal and configured to receive a direction signal, wherein the third logic gate is configured to assert an output bit signal when only one of the state signal and the direction signal is asserted.

11. The sequencer of claim 10, wherein the third logic gate is an exclusive-OR gate.

12. The sequencer of claim 9, wherein the first and second logic gates are NAND gates.

13. The sequencer of claim 9, wherein the flip-flops are each further configured to receive a clear signal, and wherein the flip-flops are configured to reset the state signals to a predetermined state when the clear signal is asserted.

14. A method for generating a selected moving inversion address sequence, wherein the method comprises:
asserting a selected one of a plurality of least significant bit selector lines which are each coupled to a corresponding cell in a ring of cells, wherein each cell is configured to receive a toggle signal from a preceding cell;
driving a direction signal to indicate a desired direction, wherein each cell is configured to receive the direction signal and configured to invert an output bit signal when the direction signal is asserted; and
providing transitions in a clock signal coupled to all of the cells, wherein each cell is configured to toggle the output bit signal when the toggle signal from the preceding cell is asserted across a transition in the clock signal, wherein each cell is configured to assert a toggle signal to a subsequent cell when the corresponding least significant bit selector line is asserted, and wherein each cell is configured to assert the toggle signal to a subsequent cell substantially half as often as the toggle signal from the previous cell is asserted when the least significant bit selector line is de-asserted.

15. The method of claim 14, further comprising:
momentarily asserting a clear signal before providing transitions.

* * * * *